(12) United States Patent
Yamada et al.

(10) Patent No.: US 6,521,991 B1
(45) Date of Patent: Feb. 18, 2003

(54) THERMOELECTRIC MODULE

(75) Inventors: Kazukiyo Yamada, Ibaragi (JP); Kohei Tashiro, Kagoshima (JP); Hidenori Esaki, Wako (JP); Tomohide Kudou, Wako (JP)

(73) Assignees: Morix Corporation, Komak (JP); Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/718,171

(22) Filed: Nov. 21, 2000

(30) Foreign Application Priority Data

Nov. 26, 1999 (JP) ............................................ 11-336690

(51) Int. Cl.⁷ ............................................... H01L 23/34
(52) U.S. Cl. ..................... 257/712; 257/62; 257/633; 257/666; 257/930
(58) Field of Search ........................ 257/666, 62, 633, 257/930, 712; 438/22; 62/3.4; 136/203

(56) References Cited

U.S. PATENT DOCUMENTS

| | | |
|---|---|---|
| 2,844,638 A | 7/1958 | Lindenblad |
| 3,212,274 A | 10/1965 | Eidus |
| 3,240,628 A | 3/1966 | Sonntag |
| 3,834,171 A | 9/1974 | Johansson |
| 4,253,515 A | 3/1981 | Swiatosz |
| 4,907,060 A | 3/1990 | Nelson et al. |
| 5,031,689 A | 7/1991 | Jones et al. |
| 5,156,004 A | 10/1992 | Wu et al. |
| 5,171,372 A | 12/1992 | Recine |
| 5,441,576 A | 8/1995 | Bierschenk et al. |
| 5,713,208 A | 2/1998 | Chen et al. |
| 5,936,192 A * | 8/1999 | Tauchi .......................... 136/203 |
| 5,950,067 A * | 9/1999 | Maegawa et al. ............... 438/22 |
| 6,097,088 A | 8/2000 | Sakuragi |
| 6,101,815 A * | 8/2000 | van Oort et al. ................ 62/3.4 |
| 6,226,994 B1 | 5/2001 | Yamada et al. |
| 6,233,944 B1 | 5/2001 | Yamada et al. |

FOREIGN PATENT DOCUMENTS

| | | |
|---|---|---|
| DE | 11 74 810 | 7/1964 |
| DE | 2650593 | 5/1977 |
| DE | 4326662 | 2/1995 |
| EP | 117743 | 9/1984 |
| FR | 1323569 | 7/1963 |
| GB | 2 119 169 | 11/1983 |
| GB | 2119170 | 11/1983 |
| JP | 34-595 | 2/1959 |
| JP | 37-24548 UM | 9/1962 |
| JP | 38-27922 UM | 12/1963 |
| JP | 40-23300 | 10/1965 |
| JP | 48-32942 | 10/1973 |
| JP | 58-58348 | 4/1983 |
| JP | 61-172358 | 8/1986 |
| JP | 62-15842 | 1/1987 |
| JP | 05-160441 | 6/1993 |
| JP | 05-175556 | 7/1993 |
| JP | 7-202275 | 8/1995 |
| JP | 07-326803 | 12/1995 |
| JP | 08-228027 | 9/1996 |
| JP | 10065224 | 3/1998 |
| JP | 2000-58930 | 2/2000 |

* cited by examiner

Primary Examiner—Richard Elms
Assistant Examiner—Douglas M Menz
(74) Attorney, Agent, or Firm—Brinks Hofer Gilson & Lione

(57) ABSTRACT

Connection of the leads for a thermoelectric module is readily accomplished, and after connection, the tensile strength of the connection is enhanced. One ends of the front and back side lead patterns for the thermoelectric module, formed on a support plate, are connected by solder to a Cu rod provided at an end of a group of thermoelectric semiconductor elements affixed to the support plate. After the front end of the lead for the thermoelectric module is bent and passed from the side of the front lead pattern through a through hole formed between the front and back side lead patterns, the front end is connected to the back side lead pattern by solder.

11 Claims, 7 Drawing Sheets

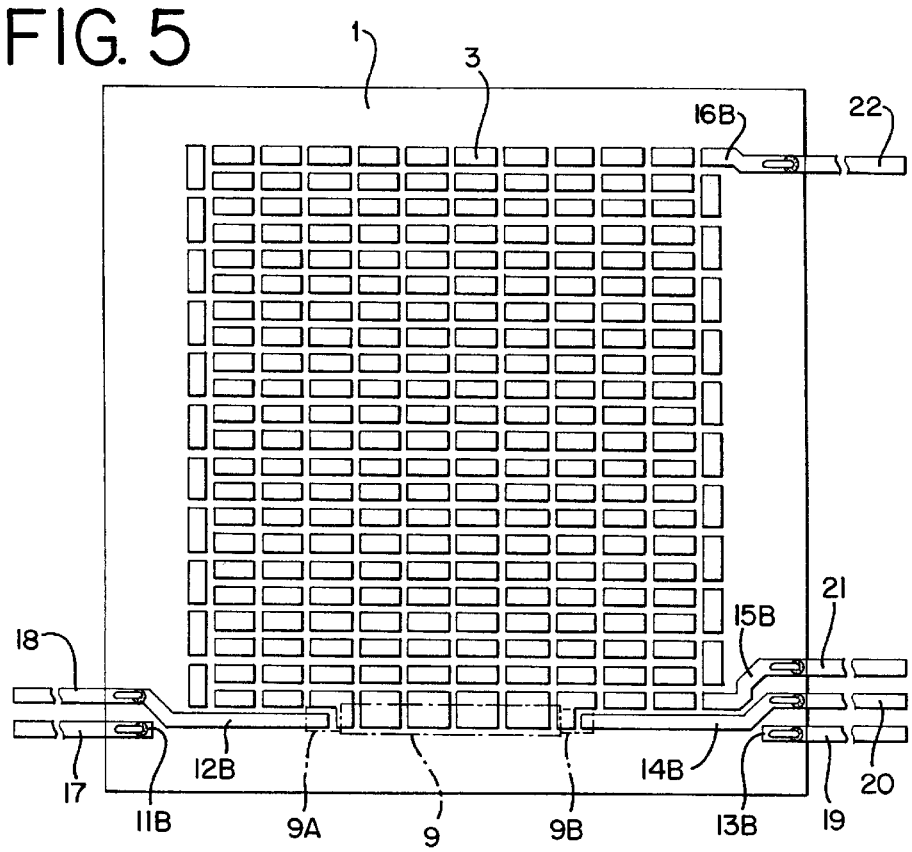
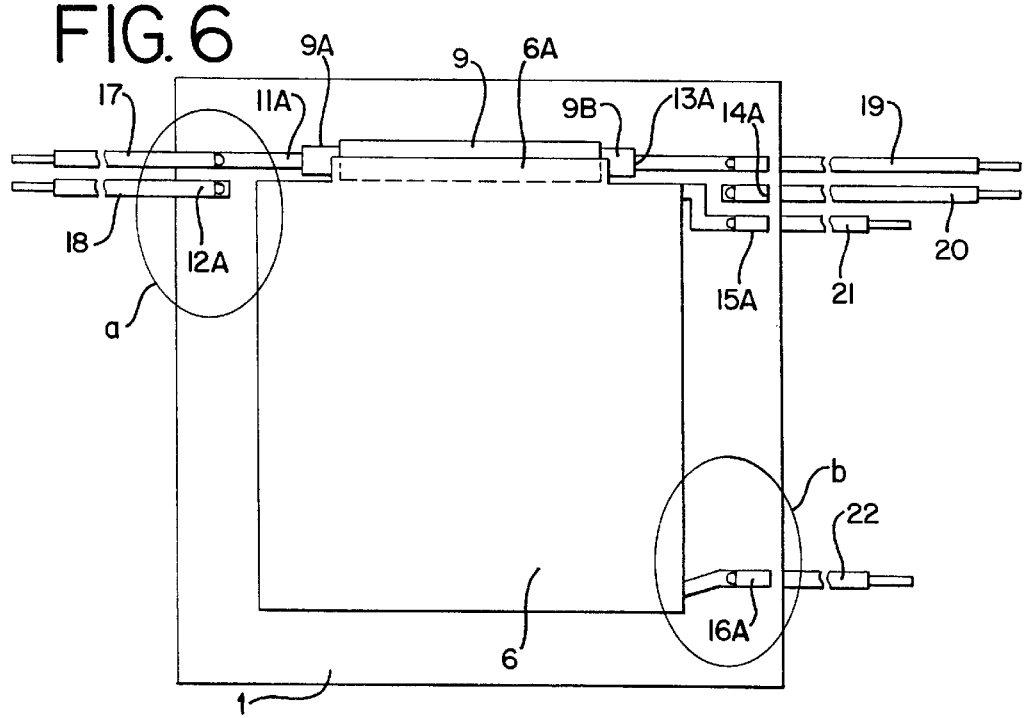

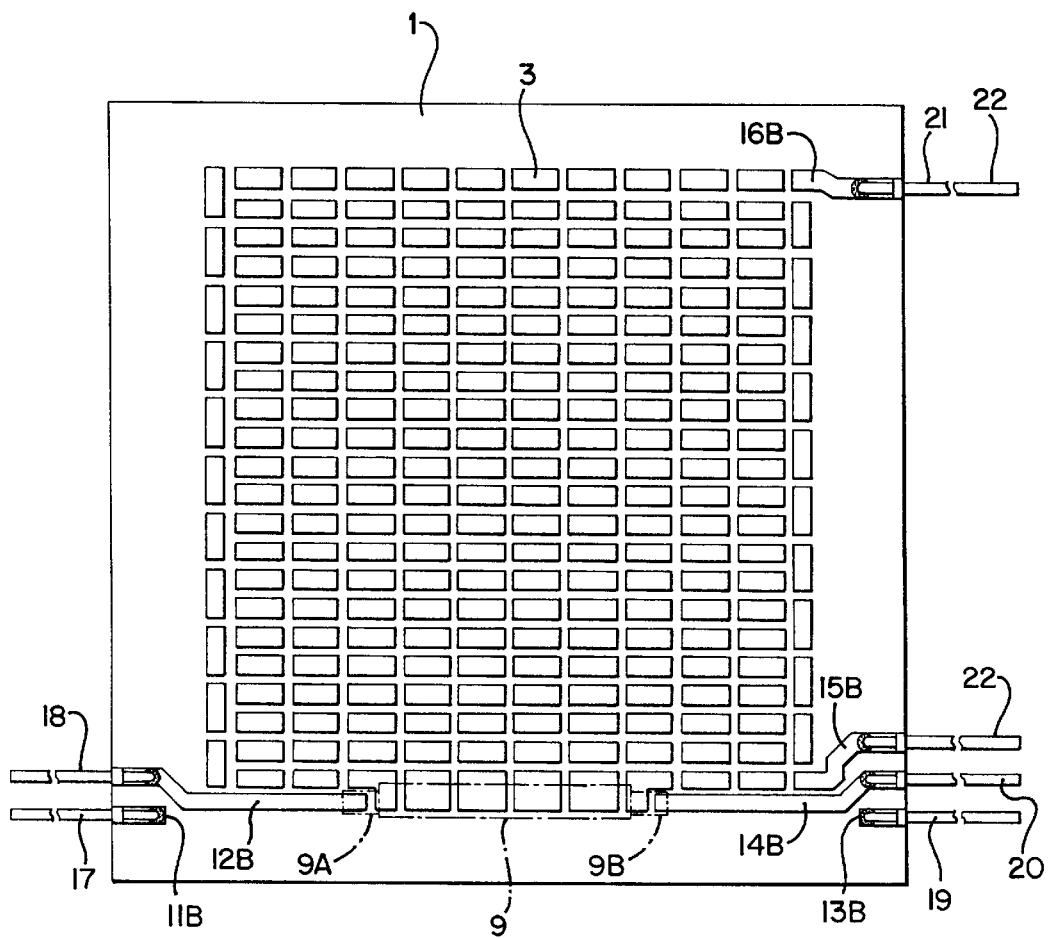

THERMOELECTRIC MODULE

BACKGROUND OF THE INVENTION

The present invention relates to a thermoelectric module using thermoelectric semiconductor elements such as Peltier devices, and in particular, the present invention relates to a thermoelectric module to which lead wires can be readily connected and have a high tensile strength after connection, and wherein can be installed temperature detectors.

FIGS. 11(a) and (b) show the configuration of a typical thermoelectric module known of in the past. Here, FIG. 11(a) is a front view, and FIG. 11(b) is a perspective view. As shown in these drawings, in the conventional thermoelectric module, thermoelectric semiconductor elements 41 are formed from alternating n-type thermoelectric semiconductor elements and p-type thermoelectric semiconductor elements, with the upper surfaces and lower surfaces of the thermoelectric semiconductor elements 41 connected to their respective metal electrodes 42, 43. The thermoelectric semiconductor elements 41 are alternately connected to metal electrodes 42, 43 at the upper surfaces and the lower surfaces, so that all of the thermoelectric semiconductor elements 41 are eventually connected in series. The connections between the upper and lower metal electrodes 42, 43 and the thermoelectric semiconductor elements 41 are performed by soldering. The metal electrodes 42, 43 of the upper surfaces and the lower surfaces are connected to metallized ceramic substrates 44, 45, so that the entire assembly is immobilized as a rigid body.

When a direct current source 46 is connected to the electrodes of this thermoelectric module, and a current flows in the direction from the n-type semiconductor elements to the p-type semiconductor elements, heat is absorbed on the side of the upper electrodes 42 due to the Peltier effect, and heat is generated on the side of the lower electrodes 43. That is to say, as shown in FIG. 11(a), the upper portion of the thermoelectric module forms a heat absorbing side (cold junction) 47, and the lower portion forms a heat generating side (hot junction) 48. When the power source connection direction is reversed, the heat absorption and heat generation sides are switched. By utilizing this phenomenon, the thermoelectric module can be employed in cooling and heating devices. Thermoelectric modules are used in a wide range of applications, from the cooling of LSIs (large-scale integrated circuits), computer CPUs (central processing units), or laser diodes, to refrigerators.

However, thermoelectric modules of the prior art have the drawback that the tensile strength of lead wires is low, since leads for the flow of direct current to the metal electrodes are directly soldered to the metal electrodes.

Furthermore, it may happen that when cooling/heating is carried out using the thermoelectric module, the temperature of the thermoelectric module becomes extremely high for some reason. It has therefore been desired that the thermoelectric module has a means for preventing the thermal destruction of the thermoelectric module by detecting a predetermined temperature and, for instance, cutting off the supply of current thereto prior to destruction of the thermoelectric module. There is also a need to control the cooling side or the heating side to a predetermined temperature when heating/cooling is carried out using said thermoelectric module. To achieve this, it is necessary to accurately measure the temperature of the thermoelectric semiconductor elements. In conventional thermoelectric modules, however, even if one tries to measure the temperature of the contact surface with the lower metal electrode which is the highest temperature portion of the thermoelectric semiconductor element, there is no space to install a temperature detector in the thermoelectric module, so that in actual practice, the temperature of the lower surface of the lower side ceramic substrate is measured indirectly from outside of the thermoelectric module. Accordingly, it is not possible to accurately measure the temperature of thermoelectric semiconductor elements.

BRIEF SUMMARY OF THE INVENTION

An object of the present invention is to provide a thermoelectric module to which lead wires can be readily connected and have a high tensile strength after connection.

Another object of the present invention is to provide a thermoelectric module having a space to install a temperature detector within the thermoelectric module.

A further object of the present invention is to provide a thermoelectric module within which a temperature detector is installed.

The thermoelectric module according to the present invention is provided with a support plate; p-type thermoelectric semiconductor elements and n-type thermoelectric semiconductor elements affixed to the support plate; first metal electrodes connected to first surfaces of the p-type thermoelectric semiconductor elements and n-type thermoelectric semiconductor elements; second metal electrodes connected to second surfaces of the p-type thermoelectric semiconductor elements and n-type thermoelectric semiconductor elements; a first thermally conductive electrically insulating thin film connected to the first metal electrodes; a second thermally conductive electrically insulating thin film connected to the second metal electrodes; and lead patterns formed on end portions of front or back of the support plate for connecting leads of the thermoelectric semiconductor elements. In accordance with this constitution, it is easy to connect the leads of the thermoelectric elements.

Furthermore, the thermoelectric module according to the present invention is such that the first lead pattern is formed on each of the front and back surfaces of the support plate, and a through hole passes through between the lead patterns on both surfaces. A front end of the lead for the thermoelectric module is bent to pass through the through holes and attached by soldering. In accordance with this constitution, it is possible to increase the tensile strength after connecting the lead.

Moreover, the thermoelectric module according to the present invention has a space for installing a temperature detector on the support plate. In accordance with this constitution, it is possible to install a temperature detector within the thermoelectric module.

In addition, the thermoelectric module according to the present invention has a temperature detector installed in the space for installing said temperature detector. In accordance with this constitution, it is possible to provide a thermoelectric module with a temperature detector installed within it.

BRIEF DESCRIPTION OF THE ATTACHED DRAWINGS

Figure 2:
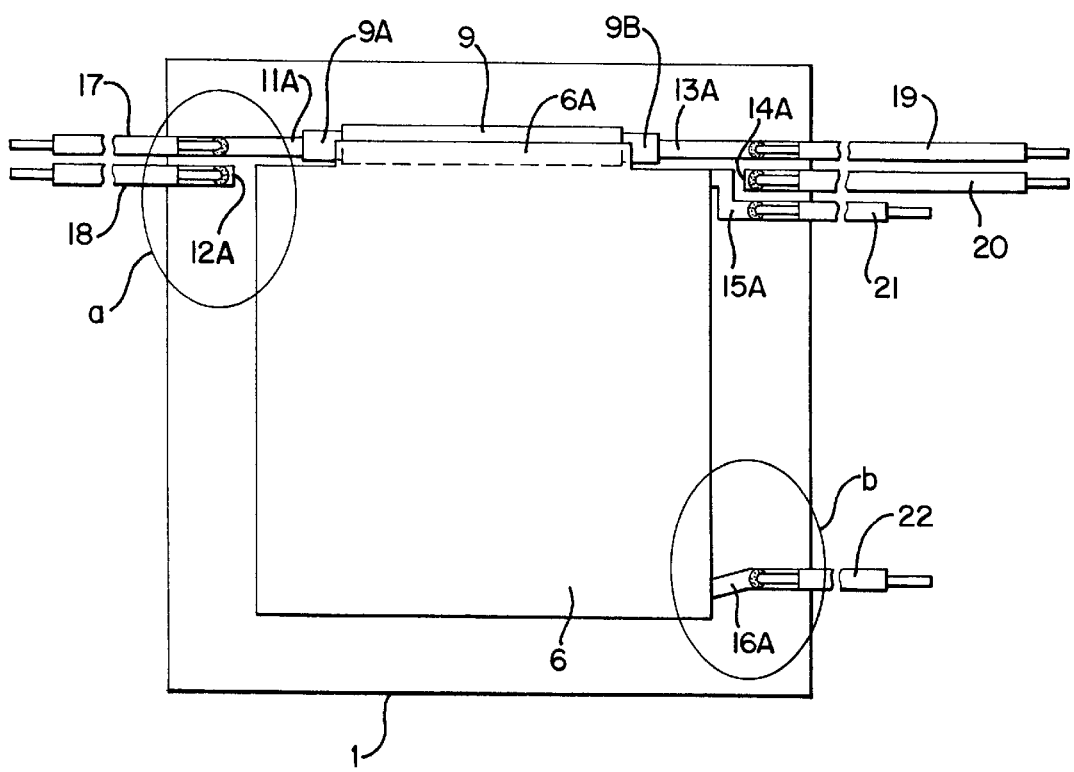
FIG. 2 is a top view of an example of a thermoelectric module of the present invention.
Figure 3A:
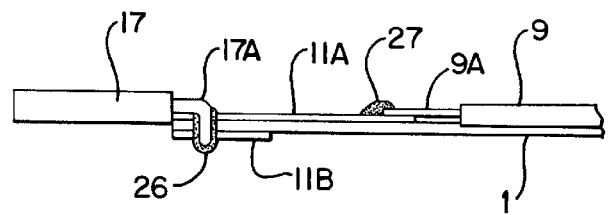
Figure 3B:
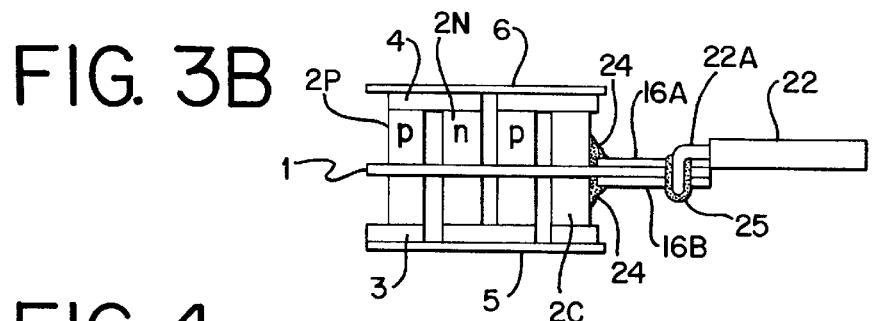

FIGS. 3(a) and 3(b) are partially enlarged views of the thermoelectric module of FIG. 2.

Figure 4:
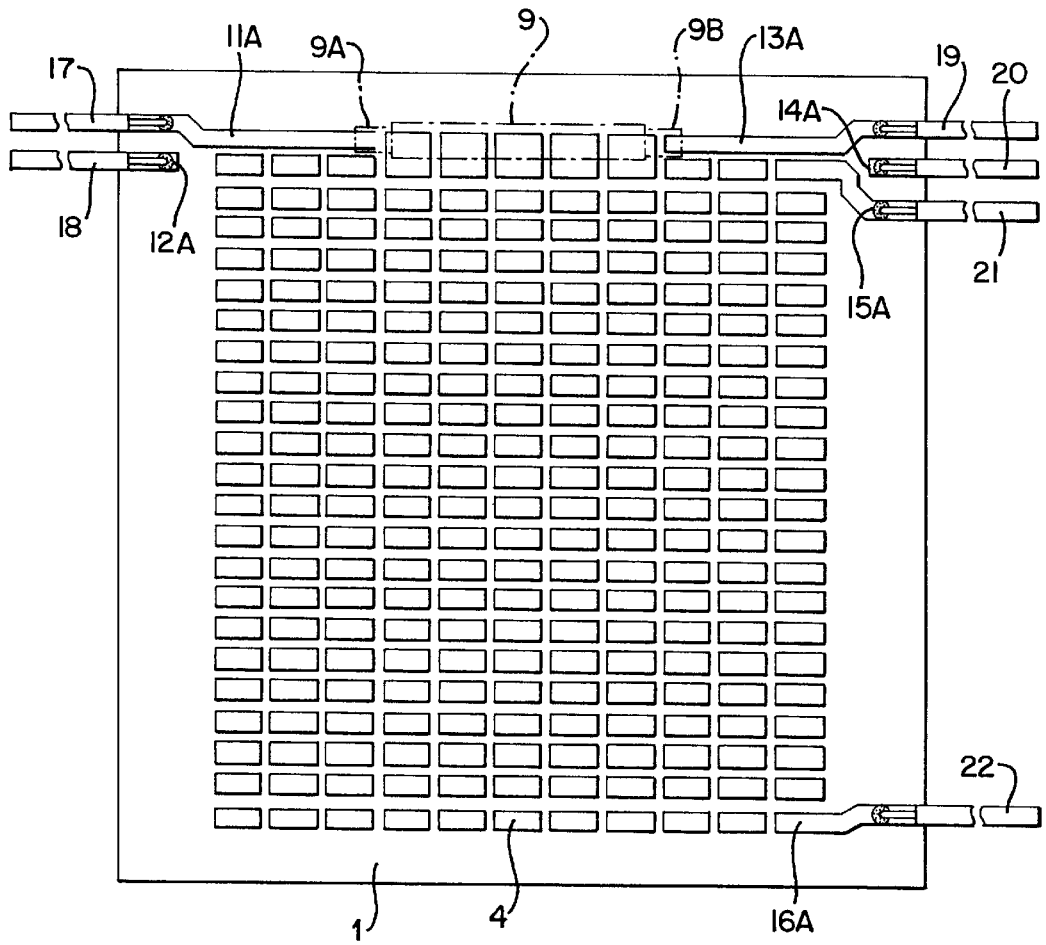

FIG. 4 is a top view illustrating the thermoelectric module of FIG. 2 in which thermally conductive electrically insulating thin film are removed.

FIG. 5 is a rear view illustrating the thermoelectric module of FIG. 2 in which thermally conductive electrically insulating thin films are removed.

FIG. 6 is a top view of another example of a thermoelectric module of the present invention.

Figure 7A:
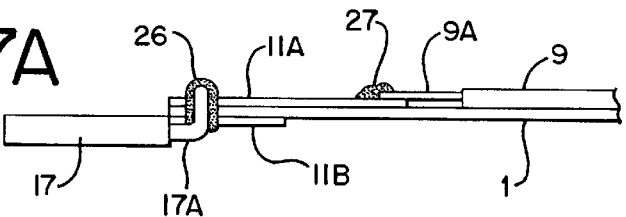
Figure 7B:
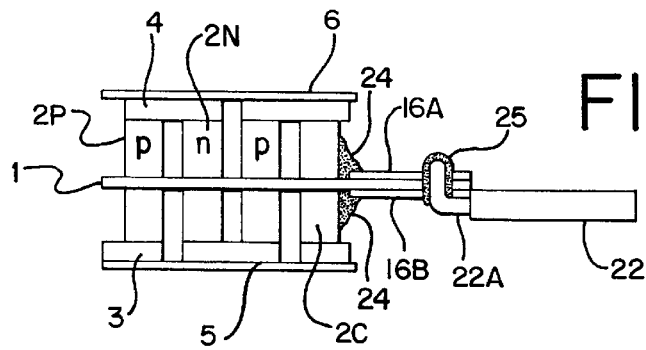

FIGS. 7(a) and 7(b), are partially enlarged views of the thermoelectric module of FIG. 6.

Figure 8:
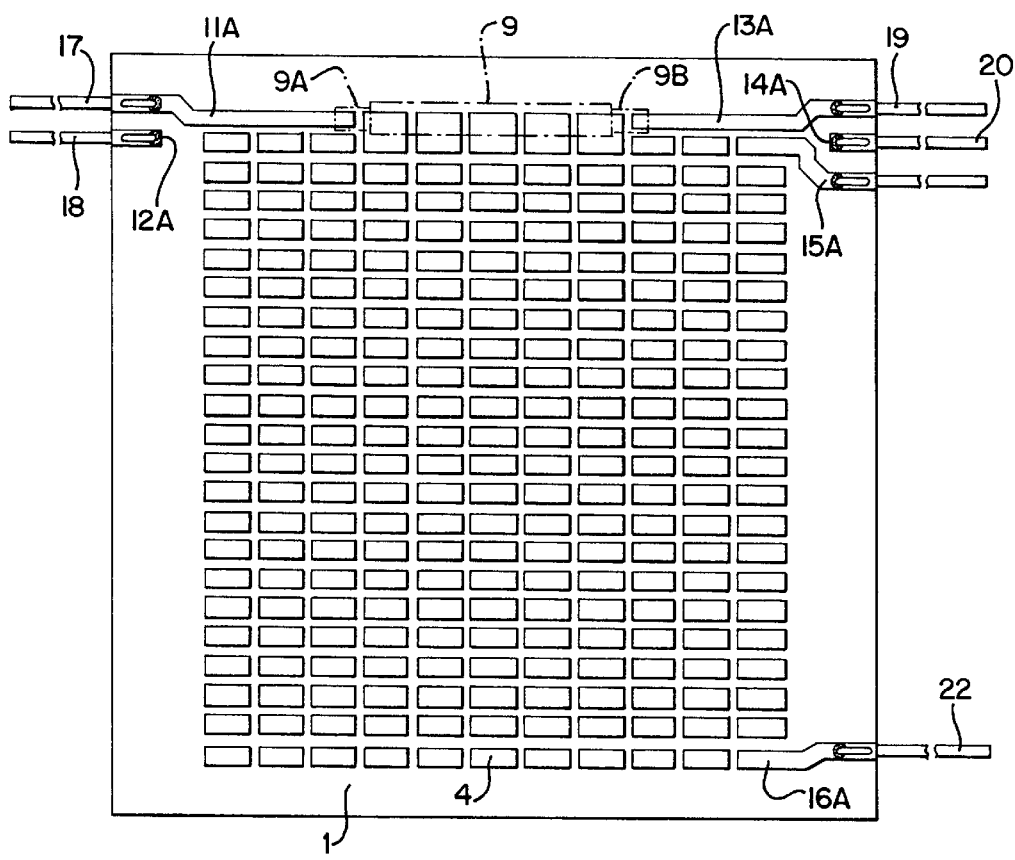

FIG. 8 is a top view illustrating the thermoelectric module of FIG. 6 in which thermally conductive electrically insulating thin films are removed.

FIG. 9 is a rear view illustrating the thermoelectric module of FIG. 6 in which thermally conductive electrically insulating thin films are removed.

FIGS. 10(a)–10(e) are drawings illustrating a separate example of the connection between the electrodes and the lead pattern for the thermoelectric module of the present invention.

Figure 11A:
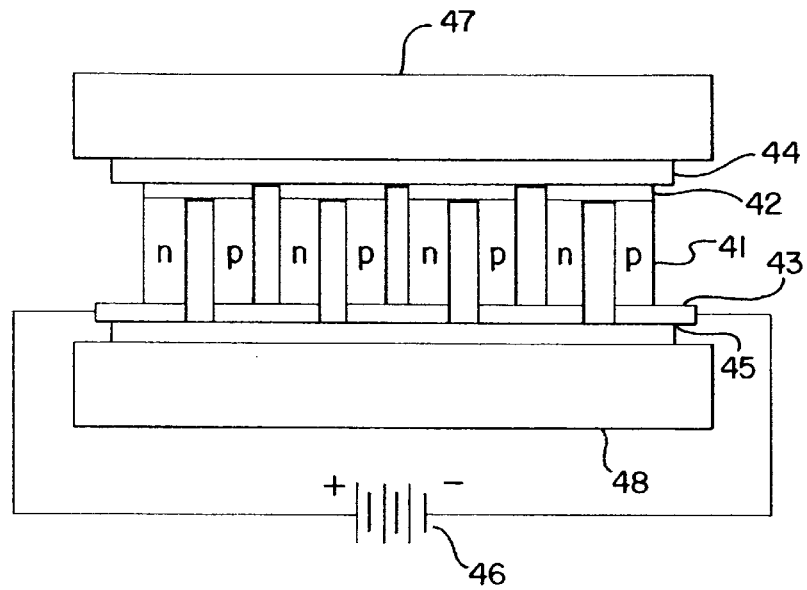
Figure 11B:
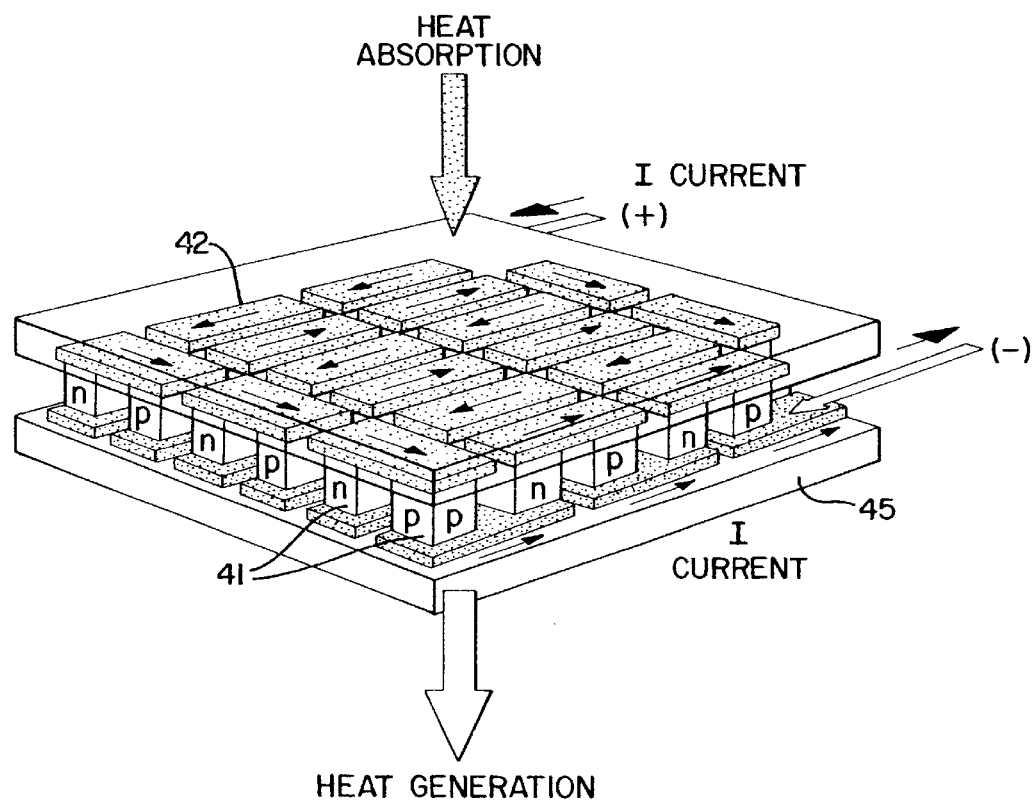

FIGS. 11(a) and 11(b) are drawings illustrating a constitutional thermoelectric module.

DETAILED DESCRIPTION OF THE INVENTION

A preferred embodiment of the present invention is described below in detail, with reference to the attached drawings.

Figure 1:
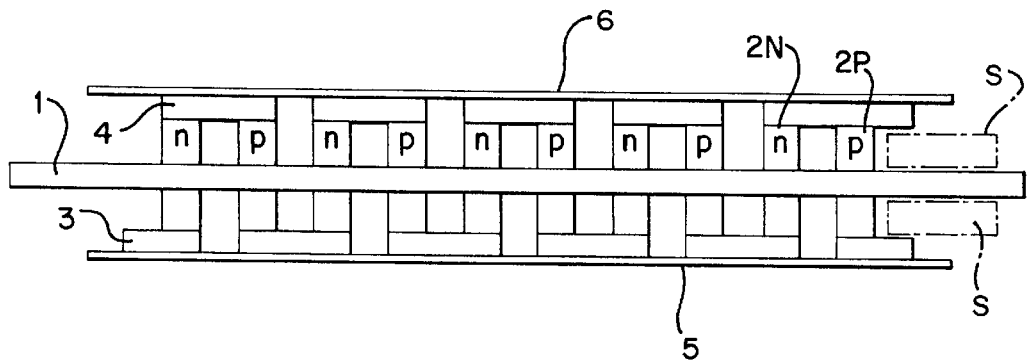
FIG. 1 is an abbreviated front view of the essential parts of a thermoelectric module of the present invention.

FIG. 1 is an abbreviated front view of the essential parts of a thermoelectric module of the present invention. This thermoelectric module has a structure such that p-type thermoelectric semiconductor elements 2P and n-type thermoelectric semiconductor elements 2N pass through a support plate 1 and are fixed thereto. The p-type thermoelectric semiconductor elements 2P and the n-type thermoelectric semiconductor elements 2N are arrayed alternately. To the top surfaces and bottom surfaces of the p-type thermoelectric semiconductor elements 2P and the n-type thermoelectric semiconductor elements 2N are connected, respectively, upper electrodes 4 and lower electrodes 3 formed from copper plates with a thickness on the order of 300 μm, the connections being performed by soldering. The p-type thermoelectric semiconductor elements 2P and the n-type thermoelectric semiconductor elements 2N are connected to the electrodes alternately at the upper surfaces and the lower surfaces, so that all of the thermoelectric semiconductor elements are eventually connected in series. Furthermore, To the lower surfaces of the lower electrodes 3 and to the upper surfaces of the upper electrodes 4 are connected a lower thermally conductive electrically insulating thin film 5 and an upper thermally conductive electrically insulating thin film 6 which have a thickness of several 10 to 100 μm, preferably 70–80 μm. Materials used for these thermally conductive electrically insulating thin films can be epoxy resins with added thermally conductive fillers, fluorine resins, silicon thermoconductive resins, and the like. Also, a temperature detector installation space S is provided between the end of the support plate 1 (right-hand end in the drawing) and the ends of the upper and lower thermally conductive electrically insulating thin films 5 and 6 (right-hand end in the drawing).

It should be noted that the surfaces of the upper electrodes 4 and the lower electrodes 3 are plated with Ni (nickel), although this is not pictured here. These Ni plating layers prevent the copper molecules that make up the electrodes from diffusing into the thermoelectric semiconductor element, and also prevent the electrodes from oxidizing and corroding due to moisture and the like. Moreover, it is advantageous to form a thin layer of Au (gold) on the surfaces of the Ni plating layers so as to prevent oxidation.

The temperature can be continuously measured by providing a thermocouple as a temperature detection device in the temperature detector installation space S. A polymer-based thermistor switch can also be used. When the temperature reaches a predetermined level or higher, this switch turns off, and turns on when the temperature subsequently falls, so it can be used as a device for protecting the thermoelectric module from overheating due to excessive current.

When the temperature detector is affixed only on the upper side of the support plate 1, the temperature can be measured when the upper side of FIG. 1 is used as the heat generating side. The temperature detector can be affixed to each of the upper side and the lower side of the support plate 1. It is possible to measure the temperature of the high temperature portion of the thermoelectric element by a temperature detector affixed to the lower side when the polarity of the current applied to the thermoelectric module is reversed so that the lower side is used as the heat generating side.

FIG. 2 is a top view of an example of a thermoelectric module of the present invention, and FIGS. 3(a) and (b) are partially enlarged portions labeled a and b in FIG. 2. Moreover, FIG. 4 and FIG. 5 are a top view and a rear view illustrating the thermoelectric module in which thermally conductive electrically insulating thin films 5 and 6 are removed from the module.

As shown in these drawings, the front side lead patterns 11A, 12A, 13A, and 14A for the temperature detector are formed at the left-hand and right-hand ends of the top portion of the upper surface (the surface appearing in the top view) of the support plate 1. Furthermore, the back side lead patterns 11B, 12B, 13B, and 14B for the temperature detector are formed at the left-hand and right-hand ends of the lower portion (back side of the top portion of the upper surface) of the back surface of the support plate 1. Moreover, the front side lead patterns 15A, and 16A for the thermoelectric module are formed at the right-hand end of the bottom portion of the upper surface of the support plate 1. Furthermore, the back side lead patterns 15B and 16B for the thermoelectric module are formed on the right-hand end of the upper portion (back side of the lower portion of the upper surface) of the back surface of the support plate 1. Here, through holes pass between lead patterns with the same number provided on the front side and the back side. It should be noted that the example shown here has the support plate 1 of a square planar configuration, but the configuration of the support plate can be rectangular, polygonal, circular, or any shape.

The upper thermally conductive electrically insulating thin film 6 provided above the upper surface of the support plate 1 constructed as above possesses a protrusion 6A, and a temperature detector 9 can be affixed in a temperature detector installation space provided between its lower side and the support plate 1. The temperature detector 9 affixed here can, for example, be constructed in the shape of a thin rectangular sheet, both ends of which are provided with temperature detector leads 9A and 9B. The temperature detector leads 9A and 9B are connected to one end of front side lead patterns 11A and 13A for the temperature detector by soldering. Leads 17 and 19 are connected to the other end of front side lead patterns 11A and 13A for the temperature detector by soldering.

The enlarged drawing of FIG. 3(a) shows the connections between the lead 17, the front side lead pattern 11A, and the back side lead pattern 13A. That is to say, after bending the lead front end 17A, and passing it from the front side lead pattern side 11A through the through a hole between the front side lead pattern side 11A and the back side lead pattern 11B, it is connected to the back side lead pattern 11B by means of solder 26. By connecting in this manner, the tensile strength of the lead 17 can be increased. The same is true for the lead 19 for the temperature detector. The same is also true when the temperature detector is affixed to the back surface of the support plate 1. In this case, as shown in FIG. 5, the temperature detector leads 9A and 9B are connected to the back side lead patterns 12A and 14B by soldering. Also, the leads 18 and 20 are connected by soldering to the other end of the back side lead patterns 12B and 14B. The structure of the joint is the same as for the front side.

Furthermore, one ends (the left-hand end in FIG. 2) of the front side lead patterns 15A and 16A formed on the support plate 1 are connected by soldering to a copper rod 2C provided at the end (the right-hand end in FIG. 2) of the group of thermoelectric semiconductor elements affixed to the support plate 1. Also, leads 21 and 22 are connected by soldering to the other ends of the front side lead patterns 15A and 16A.

FIG. 3(b), an enlarged drawing, illustrates the joints between the front and back side lead patterns 16A and 16B and the Cu rod 2C and between them and the lead 22. As shown in this drawing, one ends (the left-hand end in the drawing) of the front side lead pattern 16A and the back side lead pattern 16B are connected to the Cu rod 2C with solder 24. Furthermore, after bending the front end 22A of the lead 22, and passing it from the front side lead pattern side 16A through a through hole between the front side lead pattern side 16A and the back side lead pattern 16B, it is connected to the back side lead pattern 16B by means of solder 25. By connecting in this manner, the tensile strength of the lead 22 can be increased. The same is true for the lead 21. It should be noted that the Cu rod 2C is affixed to the support plate 1, passing through the support plate 1, as in the case of the thermoelectric semiconductor elements 2P and 2N.

In the thermoelectric module constructed in such a manner, when direct current voltage is applied to the pair of leads 21 and 22 for the thermoelectric module, the direct current flows to the thermoelectric semiconductor element via the ends of leads 21 and 22, the lead patterns 15A, 15B, 16A, and 16B, the Cu rod 2C, and the metal electrodes 3 and 4, producing a heat generating side and a heat absorbing side. Here, the upper side of the support plate 1 is the heat generating side. Furthermore, in this thermoelectric module, the temperature detector 9 detects the temperature of the upper side electrodes 4, and a detection signal is output from the pair of leads 17 and 19. Based on this detection signal, it becomes possible to carry out suitable temperature control, by controlling the direct current voltage and current applied to the pair of leads 21 and 22. Moreover, when a thermistor switch is used as the temperature detector 9, the temperature detector 9 detects the temperature of the upper side electrodes 4, and when the temperature exceeds a predetermined temperature, the temperature detector 9 turns itself off. If the module is constructed such that the output of this temperature detector 9 is fed back to the direct current source circuit of leads 21 and 22 to turn on and off, or increase or decrease the current or voltage, the overheating protection operation can run automatically.

FIG. 6 is a top view of another example of a thermoelectric module of the present invention, and FIGS. 7(a) and (b) are partially enlarged portions labeled a and b in FIG. 6. Moreover, FIG. 8 and FIG. 9 are a top view and a rear view illustrating the thermoelectric module in which the thermally conductive electrically insulating thin films 5 and 6 are removed from the module. Here, the essential structural elements corresponding to those of FIGS. 2–5 have the same reference numbers used in those drawings. The difference between this thermoelectric module and the thermoelectric module described with reference to FIGS. 2–5 is that the leads with respect to the back and front lead patterns are the opposite of the fixed side. That is to say, as shown in the partially enlarged drawing of FIG. 7(a), after bending the lead front end 17A for the temperature detector, and passing it from the side of the back side lead pattern 11B through a through hole formed between the back side lead pattern 11B and the front side lead pattern 11A, it is connected to the front side lead pattern 11A by means of solder 26. Furthermore, as shown in the partially enlarged drawing of FIG. 7(b), after bending the front end 22A for the thermoelectric module, and passing it from the side of the back side lead pattern 16B through a through hole formed between the back side lead pattern 16B and the front side lead pattern 16A, it is connected to the front side lead pattern 16A by means of solder 25.

Since the structure and operation of the other parts of this thermoelectric module are the same as for the thermoelectric module shown in FIGS. 2–5, the descriptions thereof are omitted. As above, the thermoelectric modules of the preferred embodiments of the present invention have the following advantages as given in (1)–(3) below.

(1) Since the lead patterns for the thermoelectric semiconductor elements and the lead patterns for the temperature detector are formed on the support plate 1, it is easy to connect these to external circuits.

(2) Since the support plate 1 has through holes formed therethrough between the lead patterns of the front surface and the back surface, and the leads are bent and passed through said through holes, and connected by soldering, the tensile strength of the leads is strengthened.

(3) Since only the metal electrodes 3 and 4 and the thermally conductive electrically insulating thin films 5 and 6 exist between the connecting surfaces of the thermoelectric semiconductor elements 2P and 2N and the metal electrodes 3 and 4, and the temperature detector 9, the temperature of the connecting surfaces can be accurately measured.

Figure 10A:
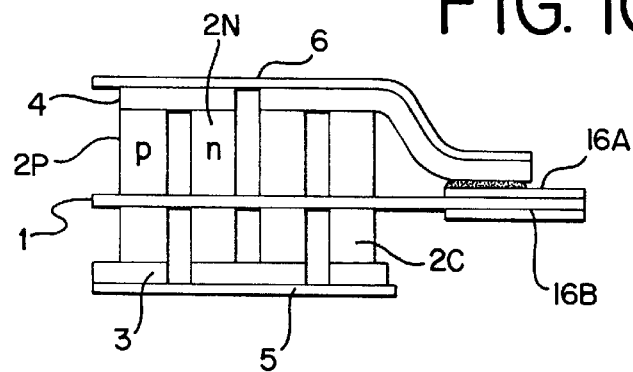
Figure 10B:
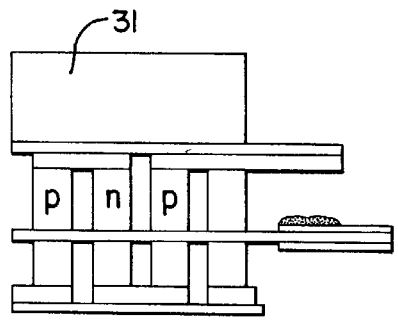
Figure 10C:
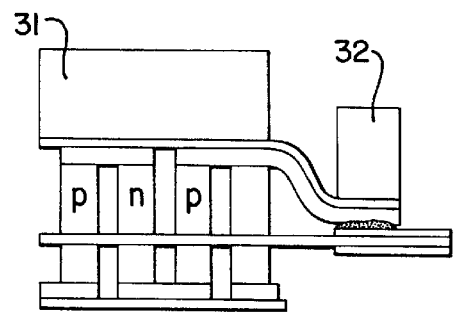
Figure 10D:
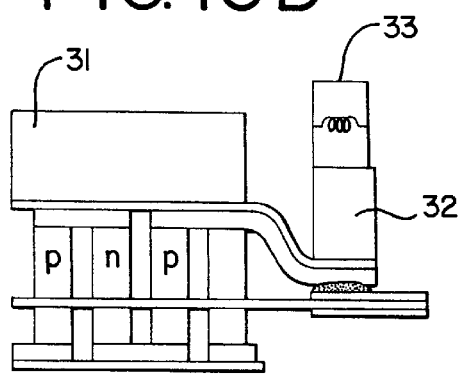
Figure 10E:
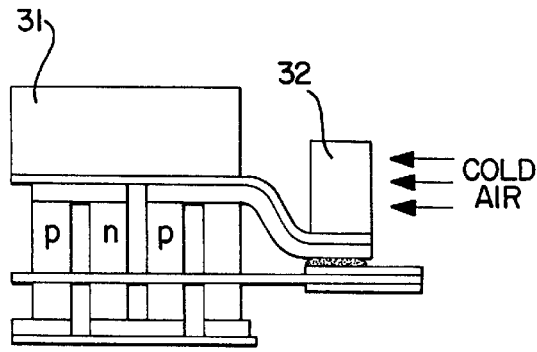

It should be noted that in the above preferred embodiments, the lead patterns 15A and 16A for the thermoelectric module are connected to the Cu rod 2C by soldering, but, as shown in FIG. 10(a), the upper side electrode 4 and the upper side thermally conductive electrically insulating thin film 6 can be extended to the end of the support plate 1, and the front end thereof can be bent and soldered to the front side lead pattern 15A. In this case, first of all, as shown in FIG. 10(b), the top surface of the upper side thermally conductive electrically insulating thin film 6 is compressed and immobilized with a compression and immobilization block 31. Next, as shown in FIG. 10 (c), the right-hand end of the top surface of the upper side thermally conductive electrically insulating thin film 6 is compressed and bent with a compression and heat transfer block 32. Next, as shown in FIG. 10(d), a heat block 33 is placed on the compression and heat transfer block 32, heated and compressed for a specified time until solder is melted. Next, as shown in FIG. 10(e), the heater block 33 is raised, the compression and heat transfer block 32 is quick-cooled with cold air, so as to prevent re-melting of the solder. After that, the compression and heat transfer block 32 and the compression and immobilization block 31 are raised.

As described in detail above, in accordance with the thermoelectric module of the present invention, it is easy to connect the leads of the thermoelectric module, since the lead patterns are provided on the support plate for connecting the leads of the thermoelectric semiconductor elements. Furthermore, in accordance with the thermoelectric module of the present invention, the tensile strength can be increased after connecting the leads, since the lead patterns are formed on the front and back surfaces of the support plate, and the front ends of the leads of the thermoelectric element bend and pass through the through holes between the lead patterns on both surfaces, and are connected by soldering. Moreover, in accordance with the thermoelectric module of the present invention, a temperature detector can be installed within the thermoelectric module, since a space is provided for a temperature detector installation space on the support plate. Also, in accordance with the thermoelectric module of the present invention, a thermoelectric module can be provided with a temperature detector installed therein, since a temperature detector is installed in the temperature detector installation space.

What is claimed is:

1. A thermoelectric module comprising:
    (a) a support plate having holes formed therein;
    (b) p-type thermoelectric semiconductor elements and n-type thermoelectric semiconductor elements each being inserted through and secured in a hole of the support plate;
    (c) first metal electrodes connected to first surfaces of the p-type thermoelectric semiconductor elements and n-type thermoelectric semiconductor elements;
    (d) second metal electrodes connected to second surfaces of the p-type thermoelectric semiconductor elements and n-type thermoelectric semiconductor elements;
    (e) a first thermally conductive electrically insulating thin film connected to the first metal electrodes;
    (f) a second thermally conductive electrically insulating thin film connected to the second metal electrodes; and
    (g) first lead patterns formed on end portions of front or back of the support plate for connecting leads for the thermoelectric semiconductor elements.

2. A thermoelectric module as defined in claim 1, wherein metal rod pieces for being electrically connected to the first lead patterns are affixed to the end portion of the support plate, in place of the thermoelectric semiconductor elements.

3. A thermoelectric module as defined in claim 2, wherein the metal rods and the first lead patterns are connected.

4. A thermoelectric module as defined in claim 2, wherein one of the first metal electrode or the second metal electrode is extended to the end of the support plate, and the front end thereof is bent and connected to the first lead pattern.

5. A thermoelectric module as defined in claim 2, wherein the first lead patterns are formed on both front and back surfaces of the support plate, a through hole passes through between the lead patterns on the both surfaces, and a front end of the lead for the thermoelectric semiconductor elements is bent and passed through the through hole and is connected by soldering.

6. A thermoelectric module as defined in claim 1, further comprising a space on the support plate for installing a temperature detector.

7. A thermoelectric module as defined in claim 6, wherein second lead patterns for connecting leads of the temperature detector are provided from the end of the front surface or the back surface of the support plate to the vicinity of the space.

8. A thermoelectric module as defined in claim 7, wherein the second lead patterns are formed on both front and back surfaces of the support plate, and a through hole passes through between the lead patterns of the both surfaces.

9. A thermoelectric module as defined in claim 6, wherein a temperature detector is installed in the space.

10. A thermoelectric module comprising:
    (a) a support plate having holes formed therein;
    (b) p-type thermoelectric semiconductor elements and n-type thermoelectric semiconductor elements each being inserted through and secured in a hole of the support plate;
    (c) first metal electrodes connected to first surfaces of the p-type thermoelectric semiconductor elements and n-type thermoelectric semiconductor elements;
    (d) second metal electrodes connected to second surfaces of the p-type thermoelectric semiconductor elements and n-type thermoelectric semiconductor elements;
    (e) a first thermally conductive electrically insulating thin film connected to the first metal electrodes;
    (f) a second thermally conductive electrically insulating thin film connected to the second metal electrodes;
    (g) first lead patterns formed on end portions of front or back of the support plate for connecting leads for the thermoelectric semiconductor elements; and
    (h) metal rod pieces electrically connected to the first lead patterns and affixed to the end portion of the support plate in place of thermoelectric semiconductor elements.

11. A thermoelectric module comprising:
    (a) a plurality of thermoelectric semiconductors connected in series and each having two ends, one end absorbing heat which is irradiated from the other end when electrical current is applied between the two ends;
    (b) a support plate having holes formed therein, wherein each of the thermoelectric semiconductors is inserted through and secured in a hole of the support plate, and
    (c) a pair of lead wires for supplying electrical current to the thermoelectric semiconductors, said pair of lead wires being fixed to the support plate; and
    (d) a pair of metal rods through which the pair of leads wires are electrically connected respectively to the two ends of the thermoelectric semiconductors.

* * * * *